United States Patent [19]

Meuriche

[11] Patent Number: 5,056,115
[45] Date of Patent: Oct. 8, 1991

[54] DEVICE FOR THE DIVISION, AT AN OPTIMUM SAMPLING RATE, OF A PASSBAND SIGNAL INTO ITS COMPONENTS ON TWO CARRIERS IN QUADRATURE

[76] Inventor: Bernard Meuriche, 64-70 rue Rouget de l'Isle, 92150 - Suresnes, France

[21] Appl. No.: 484,858

[22] Filed: Feb. 27, 1990

[30] Foreign Application Priority Data

Feb. 27, 1989 [FR] France ................ 89 02495

[51] Int. Cl.$^5$ ............................ H04L 7/06
[52] U.S. Cl. ........................ 375/81; 375/82; 329/307
[58] Field of Search ............... 329/307, 308, 309; 375/15, 39, 77, 81, 82, 120; 364/485

[56] References Cited

U.S. PATENT DOCUMENTS

| | | | |
|---|---|---|---|
| 3,956,623 | 5/1976 | Clark et al. | 375/82 |
| 4,088,957 | 5/1978 | Perkins | 375/80 |
| 4,227,152 | 10/1980 | Godard et al. | 375/14 |
| 4,253,186 | 2/1981 | Godard | 375/15 |
| 4,262,360 | 4/1981 | Bigo et al. | 375/15 |
| 4,481,646 | 11/1984 | Godard | 375/77 |
| 4,570,125 | 2/1986 | Gibson | 375/82 |
| 4,592,074 | 5/1986 | Whikehart | 375/75 |
| 4,633,426 | 12/1986 | Venier | 375/96 |
| 4,704,582 | 11/1987 | Dixon et al. | 375/82 |

FOREIGN PATENT DOCUMENTS 0032253 7/1981 European Pat. Off. .
0071506 2/1983 European Pat. Off. .

OTHER PUBLICATIONS

"Bandpass Signal Filtering and Reconstruction through Minimum-Sampling-Rate Digital Processing", pp. 675-677, 1978.
"A Generalized Polarity-Type Costas Loop for Tracking MPSK Signals", vol. COM-30, No. 10, Oct. 1982, pp. 2289-2296.
"Phase-Locked Loops", pp. 291-306, Proceedings of the IEEE, vol. 63, No. 2, Feb. 1975.
"Use Discrete Fourier Transforms to Simplify Signal Processing", Electrical Design News, vol. 28, No. 9, 1983, pp. 203-216.
"Signal-Processing μC Builds FFT-Based Spectrum Analyzer", Electronic Design, vol. 30, No. 17, 1982, pp. 149-154.

(List continued on next page.)

Primary Examiner—Benedict V. Safourek
Assistant Examiner—Young Tse
Attorney, Agent, or Firm—Wenderoth, Lind & Ponack

[57] ABSTRACT

A device for the simultaneous division of a bandpass signal $s(t) = x(t) \cos \omega_o t - y(t) \sin \omega_o t$, $\omega_o$ being an arbitrary angular velocity, into its components $x(t)$, $y(t)$, according to two carriers in quadrature $\cos \omega_o t$ and $-\sin \omega_o t$ at the angular velocity $\omega_o$, including a filter (3) for filtering the signal $s(t)$, analog transform circuitry (8;25,26) for producing the Hilbert transform $\hat{s}(t)$ of the input signal $s(t)$ provided in at least one of the channels of the device, a first sampler (6;21) for sampling the input signal $s(t)$ and a second sampler (9;22) for sampling the Hilbert transform $\hat{s}(t)$, the samplers being controlled at a sampling frequency fe supplied by a sampling oscillator, fe being not less than 2F, F being the difference between $fo = \omega_o/2\pi$ and the frequency of the spectrum of the filtered input signal $s(t)$ which is most distant from fo, and two analog-digital converters (7,10;23,24), associated with each sampler (6,9;21,22). The frequency fe and phase of the sampling oscillator are chosen as a function of fo in such a way that at any sampling instant te there is a relationship of the type:

$$\begin{array}{ll} \cos(\omega_o t_e) = 1 & \text{or} \quad \cos(\omega_o t_e) = -1 \\ \sin(\omega_o t_e) = 0 & \sin(\omega_o t_e) = 0 \\ \text{or} \quad \cos(\omega_o t_e) = 0 & \text{or} \quad \cos(\omega_o t_e) = 0 \\ \sin(\omega_o t_e) = 1 & \sin(\omega_o t_e) = -1 \end{array}$$

The sampling frequency fe can be chosen to be smaller than fo and the values of the components according to the two carriers in quadrature at $\omega_o$, x and y, are directly available at the outputs of the analog-digital converters (7,10;23,24) at the sampling instant te.

8 Claims, 7 Drawing Sheets

OTHER PUBLICATIONS

"Principles of Coherent Communications"; Andrew J. Viterbi; pp. 295-297.

"Chip Converts Cartesian Data to Polar Units at 10 MHz"; Electronic Design; Jun. 11, 1987; p. 53.

"Digital Communications"; John G. Proakis, Ph.D., P.E.; Representation of Bandpass Signals an Systems; pp. 105-107.

"An Optimum Phase Reference Detector for Fully Modulated Phase-Shift Keyed Signals"; IEEE Transactions on Aerospace and Electronic Systems; vol. AES-5; #4 (1969), pp. 627-631.

"Telecommunication Systems Engineering"; William C. Lindsey and Marvin K. Simon; pp. 62-65.

"Signal Analysis"; Athanasios Papouliz; pp. 120-121.

"Ecole Superieure D'Electricite"; A. Blanchard; pp. 1-7.

"Ecole Superieure D'Electricite"; Jacques Dupraz; p. 5.

"Signauz A Bande Passante"; Integrated Computer Systems; pp. 2-85-2-88.

DEVICE FOR THE DIVISION, AT AN OPTIMUM SAMPLING RATE, OF A PASSBAND SIGNAL INTO ITS COMPONENTS ON TWO CARRIERS IN QUADRATURE

BACKGROUND OF THE INVENTION

1. Field of the Invention

The present invention relates to digital processing, at an optimum sampling rate, of passband signals, and relates more particularly to the division of passband signals on two carriers in quadrature $\cos \omega ot - \sin \omega ot$.

2. Description of the Related Art

There has already been proposed a device for the analysis of passband signals (also called bandpass signals) comprising analog means of division on two carriers in quadrature of an input signal, means of sampling signals corresponding to the components of the input signal on two orthogonal carriers and means of analog-digital conversion of the sampled signals.

In this device described in Integrated Computer Systems 1980—Course 412, p. 2-85, 2-86, the analog section, which comprises an oscillator generating a signal at the central frequency fo of the bandpass signal, a two-channel 0°-90° coupler, two multipliers of the input signal by cos wot and sin wot and two low pass filters, is relatively large.

Furthermore, it requires a perfect filtering.

Furthermore, the oscillator used must actually function at the frequency fo since the multipliers of the input signal by cos wot and sin ωot are analog circuits and require, in order to function, to receive on their inputs the signals cos ωot and sin ωot and not samples of the latter.

Consequently, such a device is relatively complicated and costly to produce.

Another known device described in Integrated Computer Systems 1980, Course 412, p. 2-87, 2-88 provides for the division of a signal s(t) into its components x(t) and y(t) on two carriers in quadrature.

x(te) is obtained by sampling the signal s(t)=x(t) cos ωot−y(t) sin ωot at an instant te such that cos (ωote)=1, sin(ωote)=0.

Then, y(t'e) is obtained by again sampling the signal s(t) at an instant t'e such that cos (ωot'e)=0 and sin (ωot'e)=1.

In such a device, x(t) and y(t) are not available at the same time.

This disadvantage can be a nuisance in the case of controlled systems.

SUMMARY OF THE INVENTION

The purpose of the invention is to overcome the disadvantages of the known devices by creating a device for the division of bandpass signals into their components on two carriers in quadrature whose analog section is as small as possible, and which operates at a reduced sampling frequency.

Its object is therefore a device for the simultaneous division of a bandpass signal s(t)=x(t) cos ωot−y(t) sin ωot, ωo being an arbitrary angular velocity, into its components x(t) and y(t) according to two carriers cos ωot and −sin ωot, comprising means of filtering the signal s(t), means of sampling and means of analog-digital conversion, characterized in, that it comprises an analog section comprising means of producing the Hilbert transform $\hat{s}(t)$ of the input signal s(t) provided in at least one of the channels of the device, a sampler of the input signal s(t) and a sampler of the Hilbert transform $\hat{s}(t)$ of the latter, the samplers being controlled by a sampling frequency not less than 2F, F being the difference between fo = ωo/2π and the frequency of the spectrum of s(t) which is most distant from fo and at two analog-digital digital converters associated with each sampler and a digital section comprising means of multiplication of the digital values of the signals s(t) and $\hat{s}(t)$ by cos ωot and sin ωot and means of addition and subtraction of the products produced by the means of multiplication for simultaneously producing at the sampling instants, the values:

$$\begin{cases} x(t) = s(t) \cos \omega ot + \hat{s}(t) \sin \omega ot \\ y(t) = -s(t) \sin \omega ot + \hat{s}(t) \cos \omega ot. \end{cases}$$

The invention will be better understood with the help of the following description, given solely by way of example and with reference to the appended drawings in which.

DESCRIPTION OF THE PREFERRED EMBODIMENTS

As mentioned in the work by J. G. Proakis entitled "Digital Communications", MacGraw Hill, 1983, p. 105, 106, a bandpass signal about a frequency fo=-ωo/2* can be represented by the expression (1):

$$s(t) = a(t) \cos(\int o t + \phi(t)) \quad (1)$$

This representation is also applicable to random processes.

The term "about" is rather vague so that it does not in fact demand that the frequency fo should be the central frequency of the signal.

The equation (1) is equivalent to the following expression:

$$s(t) = a(t)\cos\phi(t)\cos\omega o t - a(t)\sin\phi(t)\sin\omega o t = x(t)\cos\omega o t = y(t)\sin\omega o t \quad (2)$$

where $x(t) = a(t) \cos\phi(t)$
$y(t) = a(t) \sin\phi(t)$ x and y being the signals at reduced frequency if fo is in the bandpass spectrum of the signal s(t).

A representation such as that given by the expression (2) is valid for a bandpass noise in rather general conditions (A. J. Viterbi—"Principles of coherent communications", MacGraw Hill 1966, p. 295).

Figure 1A:
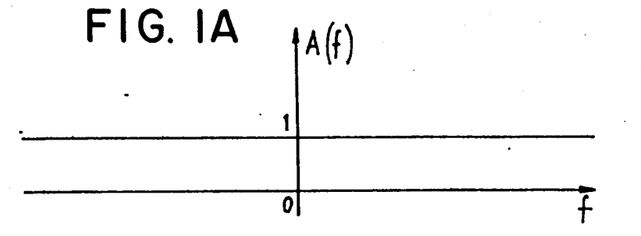
FIG. 1 is a diagram showing the amplitude and phase transfer function of a linear system performing a theoretical Hilbert transformation.
Figure 1B:
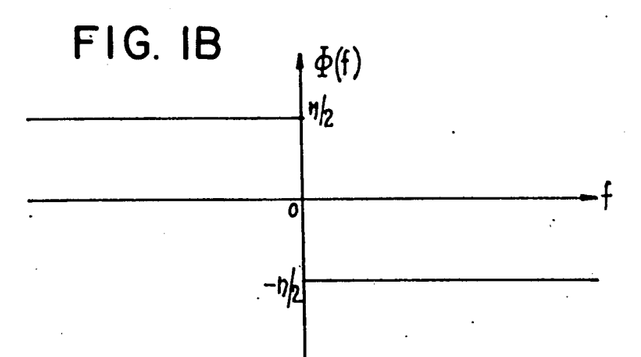

As mentioned by J. Dupraz in "Théorie de la communication et liaisons spatiales", ESE 1969, the Hilbert transformation is, as shown in FIG. 1, a linear transformation, i.e. a filtering which corresponds to the transfer function.

$$H(f) = -j \, sgn(f)$$

or $$H(f) = A(f)e^{j\Phi(f)}$$

where $A(f) = 1$ $\Phi(f) = -*/2 \, sgn(f)$

It is possible to produce an analog approximation of this transfer function using a wide band hybrid circuit which phase shifts by */2 all of the frequencies in a certain band or by using a set of two band pass filters. Assume that ŝ(t) is the Hilbert transform of the signal s(t). An analytical signal can be associated with any real signal s(t).

$$z(t) = s(t) + j\hat{s}(t)$$

z(t) is an analytical function in a half-plane which is written:

$$z(t) = (x(t) + j y(t)) e^{j\omega o t} = a(t)e^{j\phi(t)}e^{j\omega o t} = u(t)e^{j\omega o t}$$

u(t) is the complex envelope of the signal s(t) as mentioned on page 106 of the previously quoted work by J. G. Proakis.

u or x and y represent all of the useful information which s(t) contains, if ωo is fixed and known.

Figure 2A:
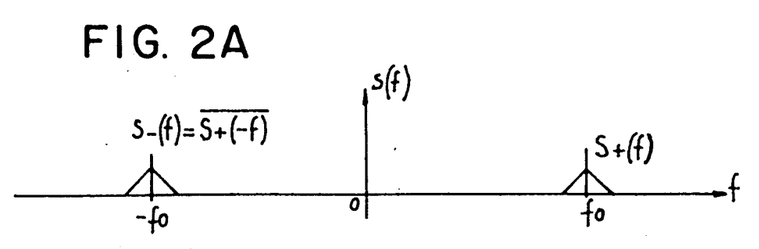
FIG. 2 is a diagram showing the spectrum S(f) of a signal s(t), the spectrum Z(f) of the associated analytical signal, and the spectrum U(f) of the complex envelope u(t) of s(t)
Figure 2B:
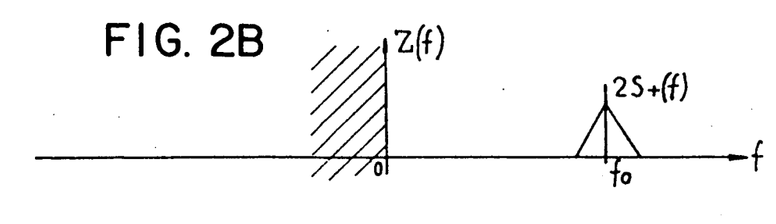
Figure 2C:
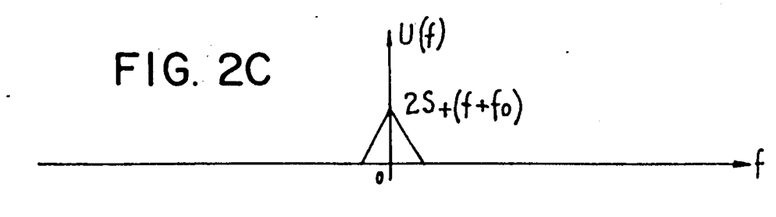

The spectra of these signals are shown in FIG. 2.

$$\hat{s}(t) = H(s(t)) = H(x(t)\cos\omega o t - y(t)\sin\omega o t) = H(x(t)\cos\omega o t) - H(y(t)\sin\omega o t)$$

since H is linear.

If the maximum frequency of the signals x(t) and y(t), assumed to be at reduced frequency, is less than fo, it is possible to write, according to A.Papoulis "Signal analysis", MacGraw Hill, p. 120, the following expressions:

$$\begin{cases} H(x(t)\cos \omega o t) = x(t) H(\cos \omega o t) \\ H(y(t)\sin \omega o t) = y(t) H(\sin \omega o t) \end{cases}$$

where $$\begin{cases} H(\cos \omega o t) = \cos(\omega o t - \pi/2) = \sin \omega o t \\ H(\sin \omega o t) = \sin(\omega o t - \pi/2) = -\cos \omega o t \end{cases}$$

The Hilbert transform of s(t), ŝ(t) then becomes:

$$\hat{s}(t) = x(t)\sin \omega o t + y(t)\cos \omega o t = a(t)\sin(\omega o t + \phi(t))$$

we therefore have:
$x(t)\cos \omega o t - y(t) \sin \omega o t = s(t)$ $$x(t)\sin \omega o t + y(t) \cos \omega o t = \hat{s}(t)$$

Solving this system for x and y, the following is obtained:

$$\begin{cases} x(t) = s(t)\cos \omega o t + \hat{s}(t) \sin \omega o t \\ y(t) = -s(t) \sin \omega o t + \hat{s}(t) \cos \omega o t \end{cases}$$

It has thus been established that the signals x(t) and y(t) obtained above, are signals at reduced frequencies which contain all of the useful information of the signal s(t).

Figure 3:
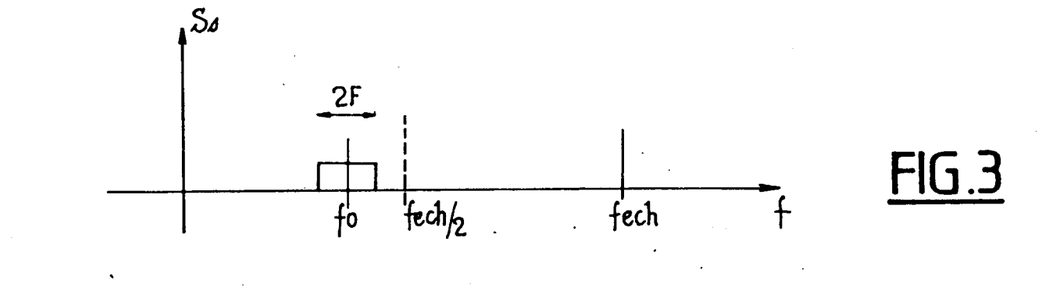
FIG. 3 is a diagram showing a possible position of the sampling frequency fech with respect to the frequency band of a bandpass signal.
Figure 4:
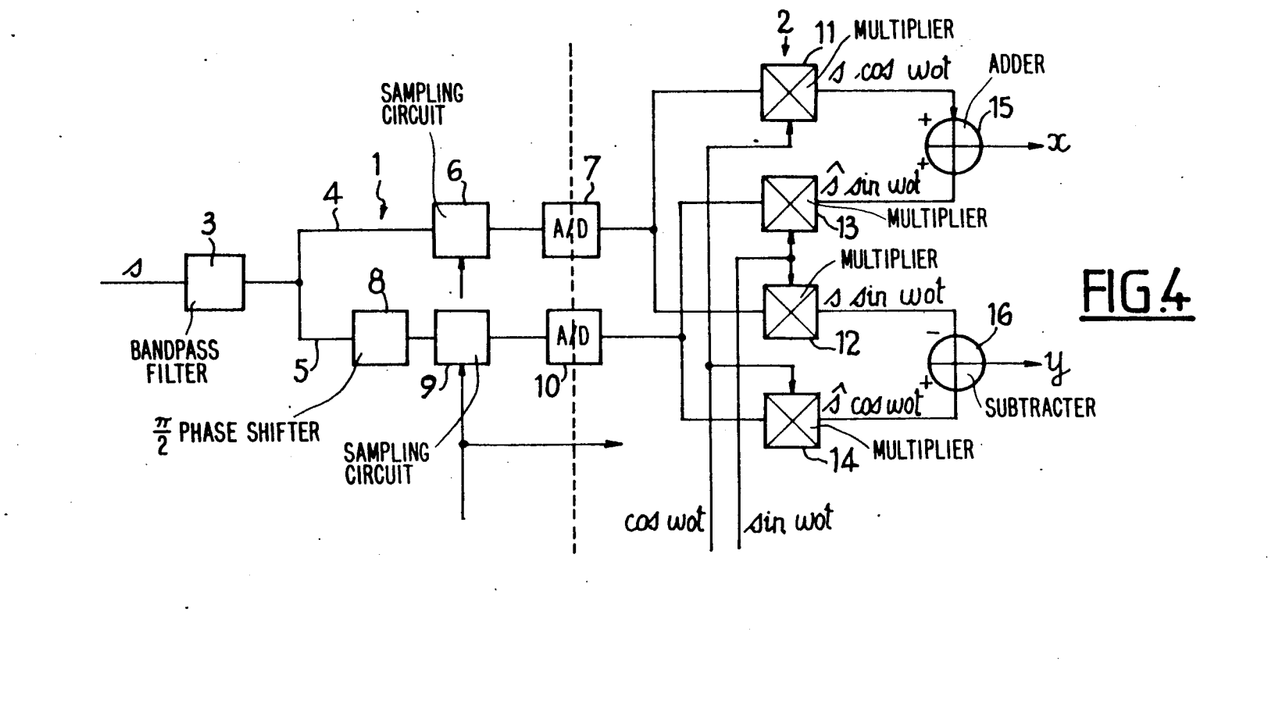
FIG. 4 is a block diagram of a device for generating the values x and y of any signal s about the frequency fo at a reduced sampling frequency.

The device shown in FIG. 4 is a device for computing the values x and y of any signal s about the frequency fo (FIG. 3).

This device comprises an analog section 1 and a digital section 2.

The analog section 1 comprises a bandpass filter 3 whose input constitutes the input of the device for the signal s and whose output is connected to two channels 4 and 5 one of which comprises a sampling circuit 6 and an analog-digital converter 7 and the other of which comprises a π/2 phase shifter 8, a sampling circuit 9 and an analog-digital converter 10.

The sampling circuits 6 and 9 are controlled by a sampling frequency fech or fe as will be seen below.

The output of the analog-digital converter 7 is connected to the first inputs of two multipliers 11 and 12 which respectively receive on their other inputs the signals cos ωot and sin ωot.

Similarly, the output of the analog-digital converter 10 is connected to first inputs of two multipliers 13 and 14 whose second inputs respectively receive the signals sin ωot and cos ωot.

The outputs of the multipliers 11 and 13 on which respectively appear the signals s cos ωot and ŝ sin ωot are applied to corresponding inputs of an adder 15 while the outputs of the multipliers 12, 14 on which the signals s sin ωot and ŝ cos ωot respectively appear are applied to the inputs of a subtracter 16.

The outputs of the adder 15 and of the subtracter 16 respectively constitute the outputs of the device for the values x and y of the signal s.

The device in FIG. 4 operates as follows:

The signal s is converted into its Hilbert transform ŝ by the π/2 phase shifter 8.

Then, the signals s and ŝ are sampled at the sampling frequency fech for example in the circuits 6 and 9 respectively and converted into digital signals by the converters 7 and 10.

At the instant tech=kTech, k being an integer and Tech being the sampling period, the numbers obtained at the outputs of the converters 7 and 10 are multiplied by cos ωotech and sin ωotech in the multipliers 11 to 14.

Thus at each sampling instant tech, there is obtained at the outputs of the multipliers:

$$\begin{cases} s(tech) \cdot \cos(\omega o tech), \; s(tech)\sin(\omega o tech) \\ \hat{s}(tech) \cdot \cos(\omega o tech), \; \hat{s}(tech)\sin(\omega o tech) \end{cases}$$

These numbers are added and subtracted in the adder 15 and the subtracter 16 in order to obtain at each instant tech, the values x and y which are signals at reduced frequency sampled at the frequency fech.

Figure 9:
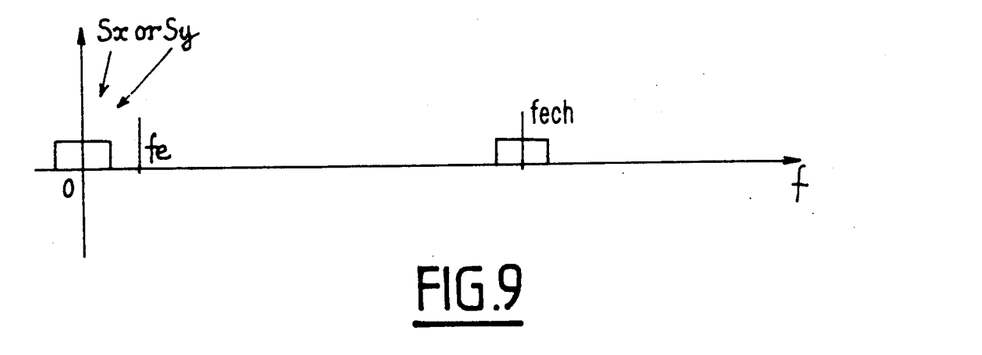
FIG. 9 is a diagram as a function of frequency showing the relative positions of the frequencies fe and fech used respectively in the devices of FIGS. 4 and 5 to 8.

In the case in which s(t) has a spectrum such as that shown in FIG. 3, i.e. if the spectrum of s(t) is about fo, the signals x and y have spectra Sx or Sy as shown in FIG. 9 (except for the line shown at fe).

Observing this figure it can be seen that the initial sampling frequency fech is much too high with respect to the frequency band of the signals x and y to be sampled.

It is therefore possible to sub-sample the outputs without losing information on condition that the new sampling frequency fe is such that:

$$fe > 2F$$

2F being the band of the bandpass signal; it is this new frequency fe which is shown in FIG. 9.

In practice, one sampling point in N is used, which divides the frequency fech by N and enables a sampling to be obtained at a frequency:

$$fe = fech/N > 2F$$

The other N−1 points created by the sampling at the frequency fech are not used.

It was not therefore necessary to calculate them since the device of FIG. 4 has no memory and has no need of points at the instants tech other than those corresponding to the instant tech.

It is therefore possible to make the device of FIG. 4 operate at a sampling frequency fe and to compute cos ωot and sin ωot only at the instants te=k Te, where Te=1/fe and k is an integer.

It is therefore possible to have a considerable reduction in the sampling frequency.

However, it is essential to provide a filter such as the filter 3 at the input of the device in order to limit the signals processed to those contained in the useful band 2F.

In fact, it can be seen that even if fo is not the central frequency of s(t), the reasoning remains the same on condition that:
a) fech > 2 (fo+F), F being the difference between fo and the frequency of s(t) which is the most distant from fo;
b) fe > 2F.

Because a great amount of time is available between the signal samples, the diagram in FIG. 4 can be simplified by providing, for example, a time multiplexing of the multiplication operations performed by the four multipliers 11 to 14.

These operations can be performed by a single multiplier to which the following are successively applied:

s(te) and cos ωote s(te) and sin ωote $\hat{s}$(te) and cos ωote $\hat{s}$(te) and sin ωote Similarly, for the addition and the subtraction, it is possible to use one signal processor in order to carry out these operations. It suffices that they can be performed within a time interval less than the sampling period Te.

Insofar as the change from the period Tech to the period Te described above gives more time for processing the signal, it is possible to envisage using only a single analog-digital converter which can be rather slow and consequently more accurate than those used in the circuit of FIG. 4.

During the period Te, the signals s and s sampled at the same instant are applied to this converter; then the digital values of these signals are applied to several multipliers (FIG. 4) or to a single multiplier.

Figure 5:
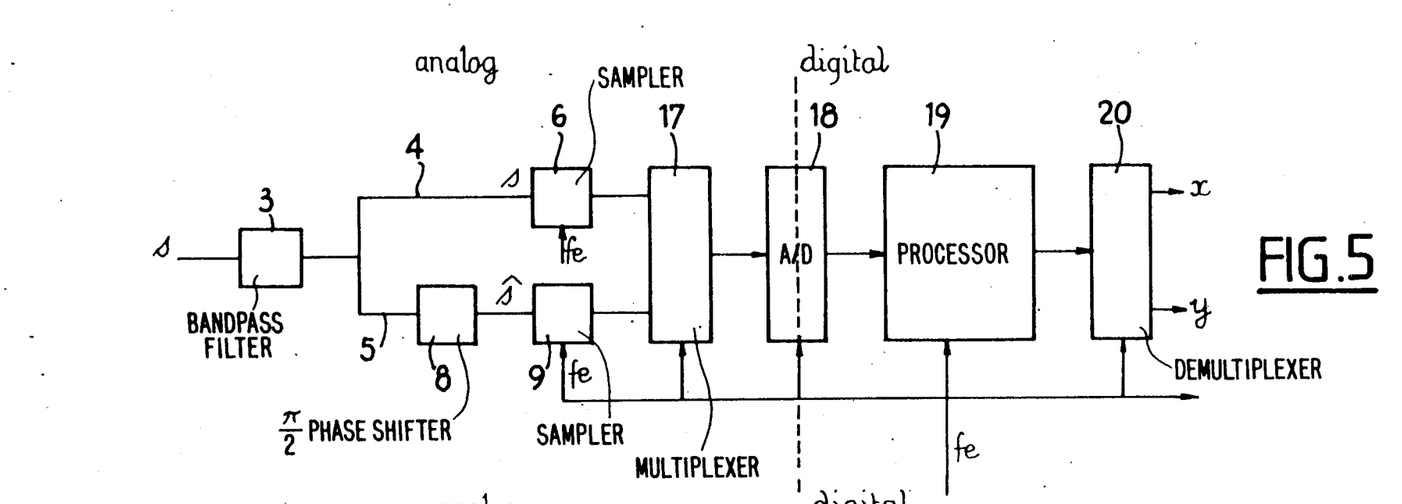
FIG. 5 is a block diagram of a device for generating values x and y of a signal s, at a reduced sampling frequency.

Taking account of the above considerations, the resulting circuit is that shown in FIG. 5.

The latter comprises the device of FIG. 4, a bandpass filter 3, a phase shifter 8 and two samplers 6 and 9 for the signals s and s.

But the outputs of the samplers 6 and 9 are connected to corresponding inputs of a multiplexer 17.

The output of the multiplexer 17 is connected to the input of a single analog-digital converter 18, the output of the latter being in its turn connected to the input of a signal-processing processor 19 for sequentially performing the operations of multiplication by the values cos ωote and sin ωote and the addition and subtraction operations on the results of the multiplications as described with reference to FIG. 4.

The output of the processor 19 is connected to a demultiplexer 20 which supplies on its outputs 21, 22 the desired signals x and y.

The samplers 6, 9, the multiplexer 17, the analog-digital converter 18 and the demultiplexer 20 are controlled at the sampling frequency fe.

The only critical components of the device in FIG. 5 are the analog components, namely the π/2 phase shifter 8 which provides the Hilbert transformation by means of a π/2 phase shift about the central frequency fo of the signal, and the samplers 6 and 9.

In FIG. 4, the signals cos ωotφ and sin ωotφ whose values are multiplied at each sampling time by the digital values of the sampled signals s and s are obtained by an oscillator which is not shown.

Now, it has been stated above that it suffices to compute cos ωote and sin ωote with te=k Te.

Consequently, any oscillator of frequency $f_{OCN}$ such that $$\cos(2\pi fote) = \cos(2\pi f_{OCN}te)$$

$$\sin(2\pi fote) = \sin(2\pi f_{OCN}te) \text{ for } te = kTe$$

enables cos ωote and sin ωote to be obtained.

If suffices that:

$$2\pi fokTe = 2\pi f_{OCN}kTe + 2n(k)\pi$$

where n(k) is an integer, k is an integer and $$Te = 1/fe \qquad (3)$$

It therefore suffices that the frequency $f_{OCN}$ of the oscillator is related to the frequency $fo$ by the following expression:

$$fo = f_{OCN} + \frac{n(k)}{k} fe$$

or $$f_{OCN} = fo - \frac{n(k)}{k} fe$$

If $n(k)/k$ and $fe$ (and therefore $fech$) are chosen such that $fo - (n(k)/k)fe = 0$, it can be seen that the central frequency of the oscillator is zero and that $\cos(\omega ote)$ and $\sin(\omega ote)$ can be computed by a very slow device.

For practical reasons of production or availability, it is possible to choose other central frequencies given by the expression (4) for the oscillator.

In the above description an expression (3) was found which enables the definition of the sampling frequency. But it is also possible to choose the phase, i.e. the instant at which the sampling is performed at this frequency.

If, for example, the following is chosen: $f_{OCN} = fe$, $f_{OCN} Te = 1$, and in the expression (3) the following is obtained: $2 k\pi fo\ Te = 2 k\pi + 2\ n(k)\pi$ $$\text{or } fo = fe\left(1 + \frac{n(k)}{k}\right) \text{ or } fe = \frac{fo}{1 + \frac{n(k)}{k}}$$

where $2F < fe \leq fo$ $$\text{Therefore } \begin{cases} \cos(\omega ok Te) = 1 \\ \sin(\omega ok Te) = 0. \end{cases}$$

The following are therefore obtained:

$$\begin{cases} x(kTe) = s(kTe) \\ y(kTe) = \hat{s}(kTe) \end{cases}$$

More generally, the same result is obtained if,:

$$\theta e = 2\pi f_o k Te = 2\pi f_{OCN} k Te + 2\ n(k)\pi = 2\mu(k)\pi$$

Therefore $\sin(\theta e) = 0$ and $\cos(\theta e) = 1$

We have $fo = \mu(k)/k\ fe$ \qquad (5)

with $2F < fe = fo\ k/\mu(k) \leq fo$ and $f_{OCN} = (\mu(k) - n(k))/k \times fe = fo - (n(k)/k)fe$.

Figure 6:
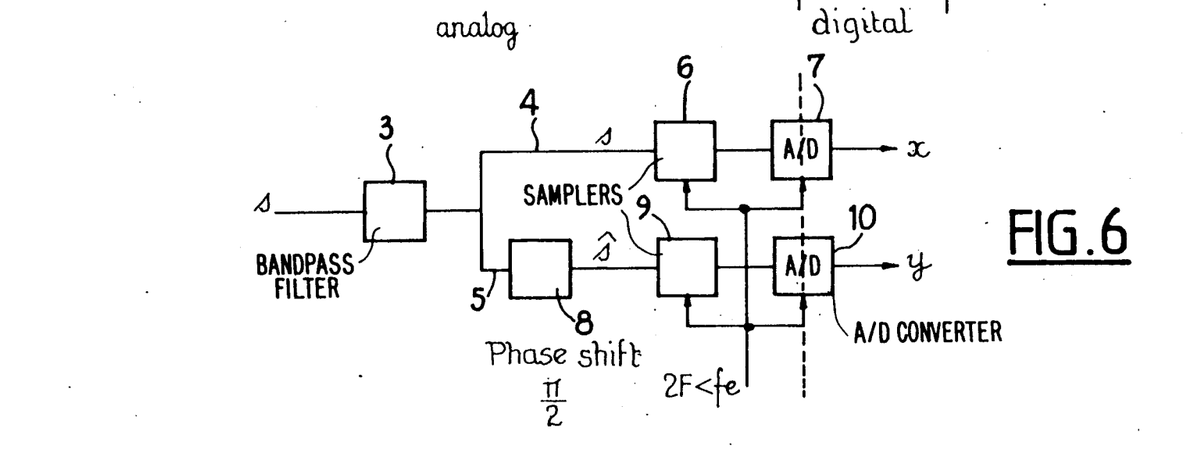
FIG. 6 is a block diagram of a device for computing x and y which is simplified with respect to that of FIG. 4.

The diagram of the system is considerably simplified and the resulting circuit is that shown in FIG. 6 which comprises only the components corresponding to the components 3 to 10 in the circuit of FIG. 4.

In this circuit, the signals x and y are directly supplied by the analog-digital converters 7 and 10 since, because of the fact that $\cos(\omega ok Te) = 1$ and $\sin(\omega ok Te) = 0$, the digital signal corresponding to the value of s obtained at the output of the converter 7 is none other than the signal x, since $x = s \times 1 + \hat{s} \times 0$, or $x = s$.

Similarly, the signal obtained at the output of the converter 10 is equal to y, since $y = -\hat{s} \times 0 + \hat{s} \times 1$ or $y = \hat{s}$ Thus, in the embodiment of FIG. 6, the digital section of the device is reduced to its simplest form.

It will be noted that in this case, the choice of the sampling frequency $fe$ implicitly fixes the central frequency $fo$ which is analysed by the expression (5) or vice versa.

The presence of the input filter 3 remains essential.

In the above example, te has been chosen such that:

$$\cos(\omega ote) = 1$$

$$\sin(\omega ote) = 0$$

and the following are obtained.

$$s(te) = x(te)$$

$$\hat{s}(te) = y(te)$$

but te could also have been chosen such that:

$$\cos(\omega ote) = -1$$

$$\sin(\omega ote) = 0$$

and the following is then obtained:

$$\begin{cases} s(te) = -x(te) \\ \hat{s}(te) = -y(te) \end{cases}$$

or $\cos(\omega ote) = 0$ and therefore $\begin{cases} s(te) = -y(te) \\ \hat{s}(te) = x(te) \end{cases}$
$\sin(\omega ote) = 1$ or again:

$$\begin{cases} \cos(\omega ote) = 0 \\ \sin(\omega ote) = -1 \end{cases} \text{ with } \begin{matrix} s(te) = y(te) \\ \hat{s}(te) = -x(te) \end{matrix}$$

Figure 7:
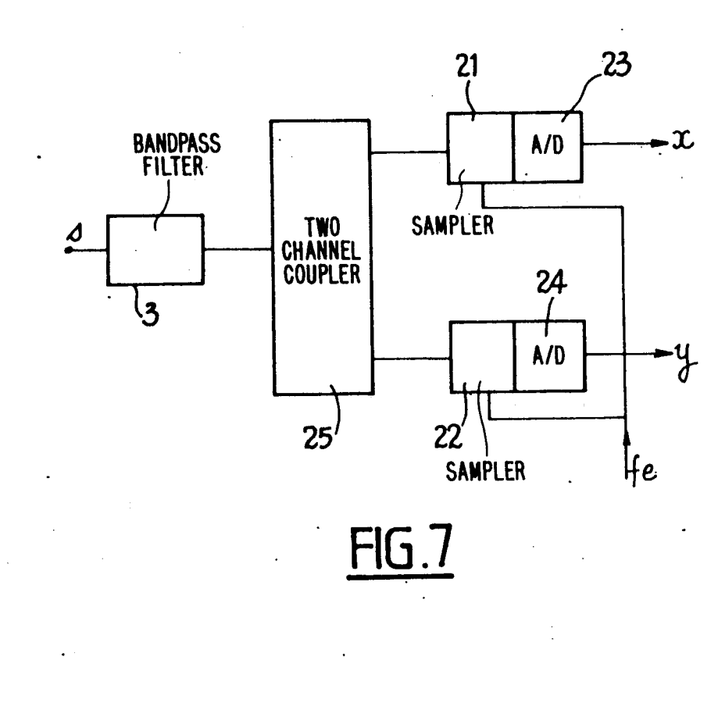
FIG. 7 is a block diagram of a computing device according to the invention which is similar to that of FIG. 6, comprising a two-channel coupler.

A variant of the device in FIG. 6 is shown in FIG. 7.

This variant comprises a bandpass filter 3 connected to two groups each formed by a sampler and an analog-digital converter 21, 22 and 23, 24 respectively, by means of a 0°–90° two-channel coupler 25.

The presence of the two-channel coupler 25 enables the provision of the sampling of its output signals which are the signals s and $\hat{s}$ at the same time on two different channels.

Figure 8:
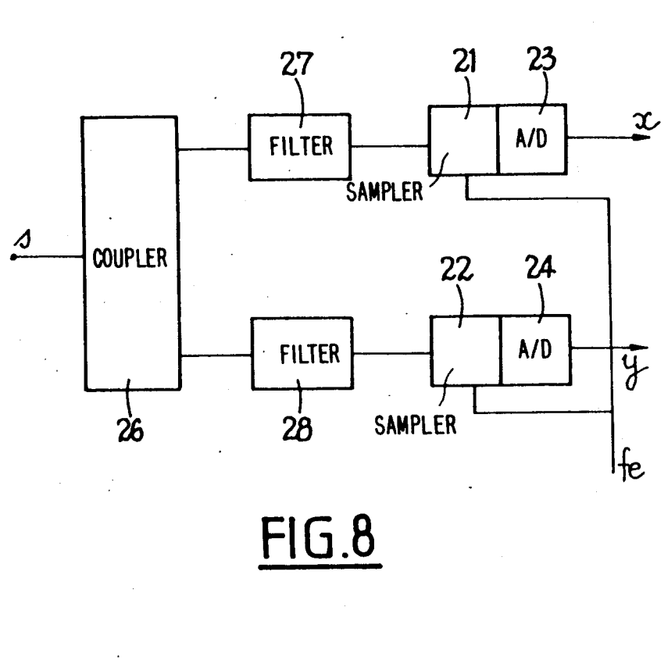
FIG. 8 is a block diagram of another variant of the device in FIG. 7.

According to another variant shown in FIG. 8, the circuit comprises a coupler 26 having two channels at 90° receiving at its input the signal s and connected by its two outputs to groups respectively formed by a sampler 21, 22 and an analog-digital converter 23, 24 by means of identical filters 27 and 28.

Instead of the 90° coupler 26 and the two identical filters 27, 28, the circuit of FIG. 8 can comprise a coupler with two channels at 0° and two different filters having the same passband but whose phases differ by 90°.

The accuracy of the adjustment of the 90° phase shift between the two channels guarantees the absence of interaction between the channels, i.e. an interaction of x on y and of y on x.

The resolution of modern measuring devices allows the measurement of phase to be envisaged with an accuracy better than 0.1°.

If the coupler used is a passive and wide band coupler, its temperature drift will be low.

An example of an embodiment of the device in FIG. 7 will be given hereafter.

Assume for example that a bandpass signal at 70 MHz+15 MHz, whose band is 30 MHz, is to be processed.

It is possible to use, in the circuit of FIG. 7, analog-digital converters and fast samplers combining the functions of the circuits 21, 22 and 23, 24, called "flash A-D converters", for example circuits of the type AD 9012 and a 90° coupler 25 operating in the above-mentioned band.

It is possible for example to use a circuit of the type MCL 55-90.

The sampling frequency of the device of the invention is therefore 35 MHz instead of a sampling frequency of 170 MHz which it would have been necessary to use with conventional devices.

For a signal in a band of 70 MHz+5 MHz, a sampling frequency of 10 MHz suffices.

The abovementioned three components can be combined in a single hybrid circuit matched to the frequency band to be processed.

The device which has just been described is applied for the production of a phase-locked loop which will be described with reference to FIG. 10. A phase-locked loop in general and the latter in particular enables the demodulation of a phase- or frequency-modulated signal and also the control of a local oscillator on a carrier.

The theory of phase-locked loops and its possible applications is amply described in technical literature.

For example descriptions appear in "Principles of Coherent Communications" by A. J. Viterbi, MacGraw Hill 1966, or "Technique des boucles á verrouillage de phase" by A. Blanchard, ESE course 1975, or "Phase lock techniques" by F. M. Gardner, John Wiley and Sons 1979.

In this circuit, the components of the circuit shown in FIG. 6 bear the same reference numbers.

The outputs of the converters 7 and 10 are connected to inputs of a circuit 30 forming a phase comparator controlled by the sampling frequency fe and with which is associated a digitally controlled oscillator 31, also controlled by the sampling frequency fe.

The output of the circuit 30 is connected to the input to the digital filter 32 whose output is in its turn looped back to the oscillator 31 via a digital amplifier 33.

The filter 32 and the amplifier 33 are controlled by the frequency fe.

Figure 10:
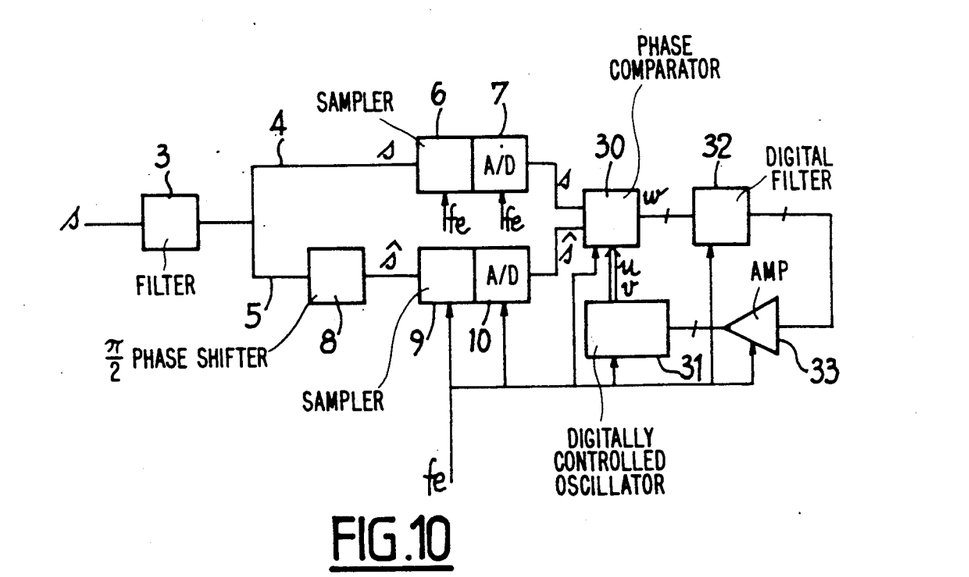
FIG. 10 is a block diagram of a phase-locked loop in the embodiment of which the device of FIG. 6 is used.

The functioning of the circuit in FIG. 10 is as follows. Assume that $\cos(\omega_{ocn}te+\psi(te))$ and $\sin(\omega_{ocn}te+\psi(te))$ are the signals generated by the digitally controlled oscillator 31, $\psi$ being the phase of the signal which it receives from the amplifier 33.

The circuit 30 performs the operation:

$$s(te)\cos(\omega_{ocn}te+\psi(te))+\hat{s}(te)\sin(\omega_{ocn}te+\psi(te))$$

Considering the fact that:

$$s(te)=a(te)\cos(\omega_o te+\psi(te))$$

and $$\hat{s}(te)=a(te)\sin(\omega_o te+\psi(te))$$

a and $\psi$ respectively being the amplitude and phase of the signal s, the following is obtained:

$$W(te)=a(te)\cos(\omega_o te+\phi(te)-\omega_{ocn}te-\psi(te))$$

If as mentioned before $\omega_{ocn}$ is chosen such that $$\omega_o te=\omega_{ocn}te+2n\pi$$

then $W(te)=a(te)\cos(\phi(te)-\psi(te))$

It is noted that the circuit 30 behaves as a phase comparator and that the phase $\psi$ of the signal $\cos(\omega_{ocn}te+\psi(te))$ will evolve under the effect of the control constituted by the filter 32 and the amplifier 33 in order to come into quadrature with the signal s as in the case of a conventional phase-locked loop.

Commercially available circuits of the type described by D. Bursky in an article in the journal "Electronic Design", 11 June 1987, page 53, enable the direct calculation of the values of a and of $\psi$ from $x=a\cos\psi$ and $y=a\sin\psi$ We therefore change directly from the modulated signal s to its amplitude and its phase at a relatively low sampling frequency fe.

It is also possible to obtain another embodiment of the phase-locked loop by associating the circuit thus obtained with a digitally controlled oscillator, a filter and an amplifier.

Figure 11:
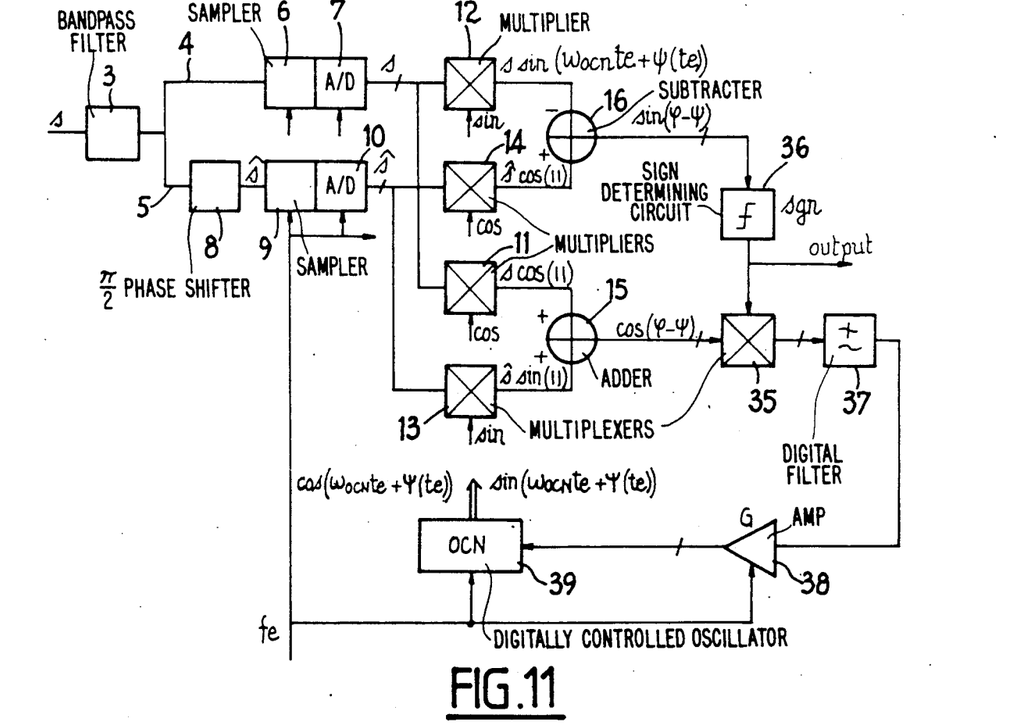
FIG. 11 is a block diagram of a demodulator of digital signals.

FIG. 11 shows a BPSK (Binary Phase Shift Keying), or MDP2 in French, digital signals demodulator according to the invention.

As mentioned by J. G. Proakis in his work "Digital Communications", MacGraw Hill, 1983, page 114, a digital modulation can be represented by a complex low pass signal.

The devices which have just been described with reference to FIGS. 4 to 8 enable the components x and y of this signal to be known.

A locking onto the carrier enables the modulation data to be retrieved.

The device of FIG. 11 comprises a circuit identical to that of FIG. 4, the same components of these circuits being denoted by the same reference numbers and to which the following components are added.

The output of the adder 15 is directly connected to an input of an additional multiplier 35 while the output of the subtracter 16 is connected to the other input of the multiplier 35 via a sign-determining circuit 36. The output of the multiplier 35 is connected via a digital filter 37 and a digital amplifier 38 to the input of a digitally controlled oscillator 39 controlled, like the amplifier 38, by the sampling frequency fe.

The oscillator 39 supplies the signals:

$$\cos(\omega_{ocn}te+\psi(te))\text{ and }\sin(\omega_{ocn}te+\psi(te))$$

and is connected to the multipliers 11 and 14 in order to apply the cosine signals to them and to the multipliers 12 and 13 in order to apply the abovementioned sine signals to them.

The output of the device is taken from the output of the sign-determining circuit 36.

The circuit shown in FIG. 11 forms a Costas loop with non-linearity in the quadrature channel which is an approximation of an optimum receiver described by S. Riter in an article in the journal "IEEE Transactions in Aerospace and Electronic Systems" Vol.AES-5 No. 4 July 1969, p. 627-631 and entitled "An optimum phase reference. detector for fully modulated phase shift keyed signals".

If s(t) is a BPSK signal, the demodulated data are available at the output of the circuit 36.

Here again the sampling frequency fe is related to the width of the high frequency modulation band.

The principle of operation of the Costas loop has been known for a rather long time. Its description can for example be found in the book by W. C. Lindsey and M. K. Simon "Telecommunication Systems Engineering", Prentice Hall, 1973, pages 62-64. That which is shown in FIG. 11 is the equivalent of a loop with a limiter.

The theory of the Costas loop with a limiter can be found in the article by S. Riter "An optimum phase reference detector for fully modulated phase shift keyed signals", IEEE Trans. AES, vol AES-5, No. 4, July 1969, p. 627–631 or in the book "Elements de communications numériques" by J. C. Bic, D. Duponteil and J. C. Imbeaux, Vol 1 p. 314.

Only the differences between the system proposed in FIG. 11 and the Costas loop with a limiter such as described in the above references are described here.

These differences are:

Firstly, the conventional method of dividing the signal on two quadrature channels, namely by using for example a 0° coupler, two balanced mixers, a 90° coupler and a VCO at the frequency of the signal, is replaced by the device described in FIG. 4.

Secondly, we again find the fact that the OCN which replaces the VCO does not operate at the frequency of the signal but at a frequency such that the expression (3) is verified, i.e. at a frequency which can be chosen to be much lower.

At the sampling instants te, $\cos(\omega_{OCN}te+\psi(te))$ and $\sin(\omega_{OCN}te+\psi(te))$ are computed. The OCN, if it is not too far in frequency in the sense of the expression (3), is synchronized according to this expression (3) as in the case of a conventional loop and it is possible to retrieve the demodulated signal (i.e. in fact the modulation) at the output of 36.

Here again, the minimum sampling frequency that can be used is related to the width of the band of the signal to be demodulated and must no longer be greater than double the maximum frequency to be demodulated.

So far in this application (BPSK demodulator) there has only been imposed, between $f_{OCN}$, fo and fe, frequency relationships such as the expression (3). But, it is also possible, as was done earlier in order to produce the device of FIG. 6, to impose phase relationships between the signals.

Figure 12:
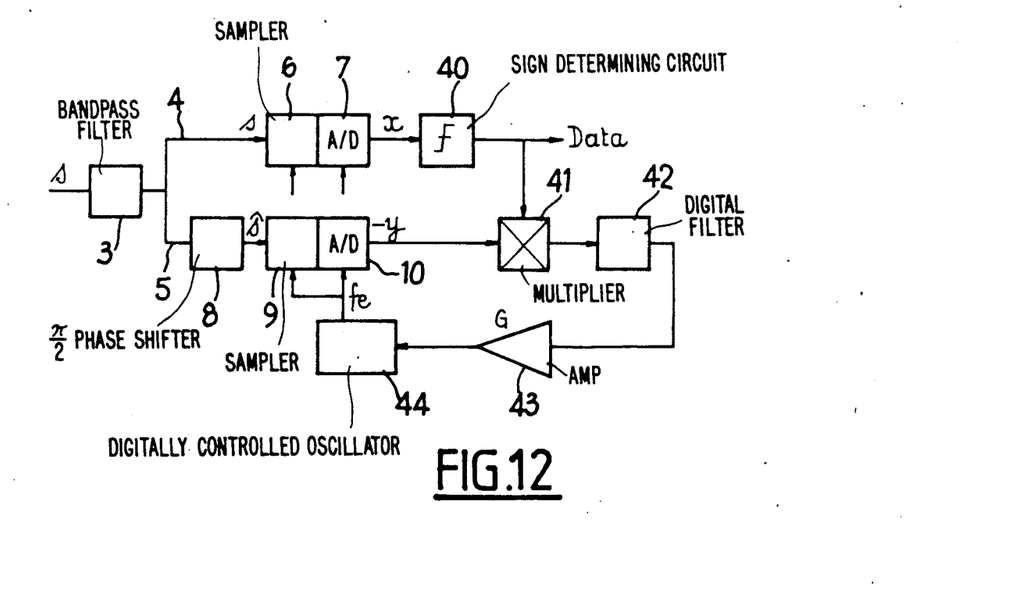
FIG. 12 is a block diagram of a demodulator of digital signals with asynchronous sampling.

The circuit of FIG. 12 is then obtained or a similar circuit depending on the choice made of taking $$\cos(\omega_{OCN}te+\psi(te))=\pm 1 \text{ or } (\sin \omega_{OCN}te+\psi(te))\pm 1$$

in order to define the sampling instant te.

This device comprises the components of the circuit of FIG. 6 to which the same reference numbers have been given.

Furthermore, at the outputs of the analog-digital converter 7 there is connected a sign-determining circuit 40 which in its turn is connected to an input of a multiplier 41 whose other input is directly connected to the output of the converter 10. The output of the multiplier 41 is connected to a loop formed by a digital filter 42, an amplifier 43 and a digitally controlled oscillator 44 which generates the sampling frequency fe for controlling the samplers 6 and 9 and the analog-digital converters 7 and 10.

The output of the circuit is taken from the output of the sign-determining circuit 40.

In the circuit of FIG. 12, the oscillator 44 functions at the sampling frequency fe.

An asynchronous sampling is therefore obtained which is synchronized on a sub-multiple of the carrier of the signal s when acquisition is achieved It is for example the transitions through 0 of the signal at the output of the oscillator. 44 which triggers the sampling The values x and $-y$ are obtained at the output of the converters 7 and 10 in the case of this example.

This type of asynchronous sampling is applicable to the phase-locked loop described previously with reference to FIG. 10.

It is possible to envisage, with devices produced with similar reasoning to that of FIG. 11 or 12, demodulating at rates of from 10 to 20 Mbits/s and even higher, signals modulated in BPSK, QPSK, OQPSK, MSK, FFSK, MPSK and QAM.

Figure 13:
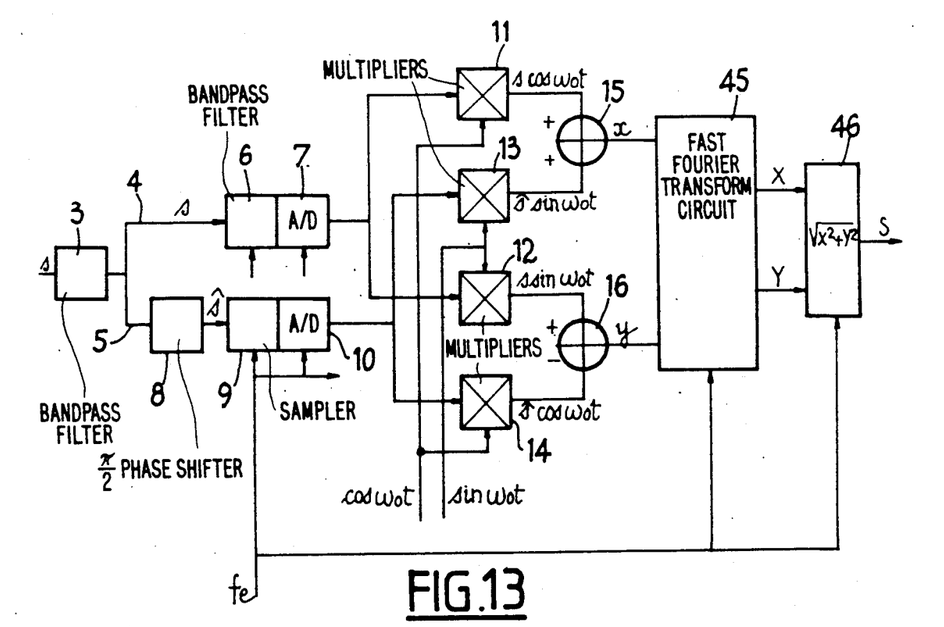
FIG. 13 is a block diagram of a spectrum analyser.

FIG. 13 shows the diagram of a spectrum analyser.

This analyser firstly comprises a circuit identical to that described with reference to FIG. 4 and whose components are denoted by the same reference numbers.

The spectrum analyser furthermore comprises a fast Fourier transformation circuit 45 whose outputs are connected to a circuit 46 for computing $\sqrt{x^2+y^2}$ which supplies at its output the spectrum of the analysed signal.

The circuit 45 and the circuit 46 are controlled by the sampling frequency fe.

Figure 14:
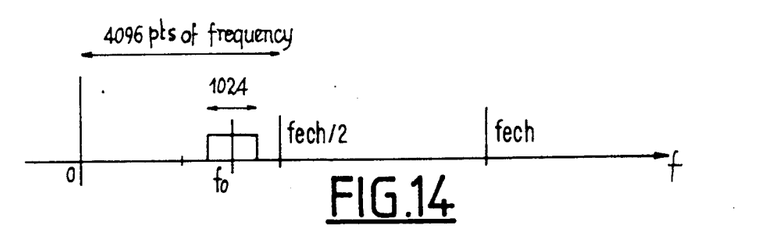
FIG. 14 is a diagram showing the band analysed by means of the device in FIG. 13.

It is assumed that it is desired to analyse the spectrum of a signal s about its central frequency fo and that a resolution of 1024 points in the analysed band is desired (FIG. 14).

One means consists in producing a fast Fourier transformation circuit which would have 4096 complex points (or frequency points) obtained from 8192 real points.

The band is analysed between 0 and $f_{ech}/2$ (FIG. 14), i.e. the Fourier transformation circuit is computed over 4096 frequency points and only the 1024 points relating to the bandpass signal s are retained.

With the circuit of FIG. 13, the sampling at the frequency $f_{ech}$ results in taking 4096 points for s and 4096 points for s.

In fact, as the Fourier transformation is performed on x and y, it is possible to reduce the frequency $f_{ech}$ in order to change to a frequency fe and only 1024 points are retained in order to have the same resolution in the band in question.

One does not therefore have a Fourier transformation over 4096 complex points but only over 1024 complex points.

Figure 15:
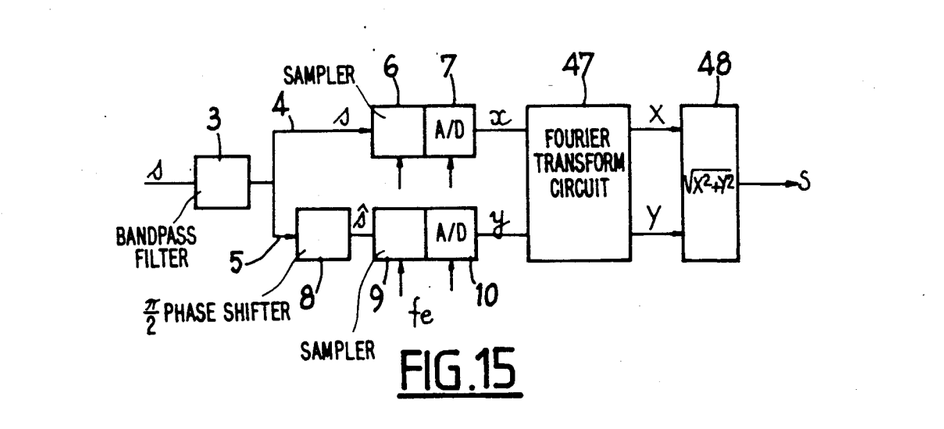
FIG. 15 is a very simplified diagram of the spectrum analyser of FIG. 13.

FIG. 15 shows an extremely simplified variant of the circuit in FIG. 13.

This circuit comprises the same components as that of FIG. 6 to which has been added a fast Fourier transformation circuit 47 connected to the outputs of the converters 7 and 10 and a circuit for computing $\sqrt{x^2+y^2}$.

The duration of the observation window for acquiring sampled values is the same as before.

The computing time is in the ratio $$\frac{N2 \log N2}{N1 \log N1} = \frac{4096 \, Log2 \, (4096)}{1024 \, Log2 \, (1024)} = 4 \times \frac{12}{10} = 4.8$$

The speed of this circuit is therefore approximately five times higher. Here again it is the band to be analysed which determines the sampling frequency fe.

I claim:

1. A device for the simultaneous division of a bandpass input signal $s(t) = x(t) \cos \omega o t - y(t) \sin \omega o t$, $\omega o$ being an arbitrary angular velocity and $x(t)$ and $y(t)$ being two components of the input signal $s(t)$, into its components $x(t)$, $y(t)$, according to two carriers $\cos \omega o t$ and $-\sin \omega o t$ in quadrature at the angular velocity $\omega o$, characterized in that it comprises an analog section comprising means (3; 27,28) and (8; 25,26; 27, 28) for filtering and producing a Hilbert transform of the input signal $s(t)$ provided in at least one of the channels of the device, a first sampler (6; 21) for sampling the filtered input signal $s(t)$ and a second sampler (9;22) for sampling the Hilbert transform $\hat{s}(t)$ of $s(t)$, the first and second samplers having a sampling rate fe controlled by a sampling oscillator at frequency fe, fe being at least 2F, F being the difference between $fo = \omega o/2\pi$ and the frequency of the spectrum of the filtered input signal $s(t)$ which is most distant from fo, and two analog-digital converters (7,10; 23, 24) respectively associated with said first and second samplers (6,9; 21, 22) and operating at the same frequency fe, wherein the frequency fe of the sampling oscillator and its phase are chosen as a function of fo such that at any sampling instant te there is a relationship of the type:

$\cos (\omega o t e) = 1$ and $\sin (\omega o t e) = 0$ or $\cos (\omega o t e) = -1$ and $\sin (\omega o t e) = 1$ or $\cos (\omega o t e) = 0$ and $\sin (\omega o t e) = -1$ whereby the sampling frequency fe can be chosen to be smaller than fo and the values of the components according to the two carrier in quadrature at $\omega o$, x and y are directly available at the outputs of the analog-digital converters (7, 10; 23, 24) at the sampling instants te and except for the sign depending on case in question.

2. A device according to claim 1, characterized in that the analog section comprises means (8) for producing the Hilbert transform $\hat{s}(t)$ of the filtered input signal $s(t)$ which are constituted by a $\pi/2$ phase shifter of the filtered input signal $s(t)$ connected in one of the channels (t) of the device between a bandpass filter (e) and the second sampler (9).

3. A device according to claim 1, characterized in that the analog section comprises means (25) for producing the Hilbert transform $\hat{s}(t)$ of the filtered input signal $s(t)$ which are constituted by a 0°–90° two-channel coupler interposed between a bandpass filter (3) and the first and second samplers (21,22).

4. A device according to claim 1, characterized in that the analog section comprises means (26) for producing the Hilbert transform $\hat{s}(t)$ of the input signal $s(t)$ which are constituted by a 0°–90° two-channel coupler connected to the input of the device and connected to each of the first and second samplers (21,22) of the two channels via a corresponding bandpass filter (27,28), the bandpass filters being identical.

5. A device according to claim 1, characterized in that the analog section comprises means (26) for producing the Hilbert transform $\hat{s}(t)$ of the input signal $s(t)$ which are constituted by 0° two-channel coupler connected to the input of the device and connected to each of the first and second samplers of the two channels via a corresponding bandpass filter (27,28), the bandpass filters having the same bandpass and having phases which are different by $\pi/2$ from one another.

6. A phase-locked loop, characterized in that it comprises a device for the division of a signal according to any of claims 1 to 5, and in that it furthermore comprises a circuit (30) forming a phase comparator controlled at the sampling frequency fe and whose inputs are connected to the outputs of the analog digital converters (7,10), a digital filter (32) controlled at the sampling frequency fe, connected to the output of the phase comparator (30), a digital amplifier (33) controlled at the sampling frequency fe, connected to the output of the digital filter (32) and a digitally controlled oscillator (31) operating at an angular velocity $\omega_{ocn}$ controlled at the sampling frequency fe, for applying to the phase comparator circuit (30) signals corresponding to the values $\cos (\omega_{ocn} t e + \psi(t e))$ and $\sin (\omega_{ocn} t e + \psi(t e))$, $\psi$ being the phase of the signal at the output of the digital filter (32) in order to enable the phase comparator circuit (30) to supply at its output a signal $w(te) = a(te) \cdot \cos(\phi(te) - \psi(te))$ in which a (te) is the amplitude of the demodulated signal and $\phi(te)$ is the phase of this signal and $\psi(te)$ is the phase of the signals supplied by the digitally controlled oscillator (31) which tends to come into quadrature with the phase of the input signal $s(t)$ under the effect of the phase-locked loop.

7. A BPSK digital signals asynchronous sampling demodulator, characterized in that it comprises a division device according to any of claims 1 to 5, and in that it furthermore comprises a digitally controlled oscillator (44) connected to the first and second samplers (6,0) and to the analog-digital converters (7,10) of the division device in order to apply to them the signal of a sampling oscillator (44) at frequency fe, the output of an analog-digital converter (10) being directly connected to one input of a multiplier (41) while the output of the other analog-digital converter (7) is connected to the other input of the multiplier via a sign-determining circuit (40), the multiplier (41) being connected to the input of the digitally controlled oscillator (44) via a digital filter (42) and an amplifier (43).

8. A spectrum analyzer for analyzing the spectrum of the signal about a central frequency fo, characterized in that it comprises a division device according to any of claims 1 to 5, a fast Fourier transformation circuit (47) connected to the outputs of the signals x and y of the division device and a circuit (48) for computing $\sqrt{x^2 + y^2}$ connected to the output of the fast Fourier transformation circuit (47).

* * * * *